United States Patent
Lee et al.

(10) Patent No.: US 7,834,332 B2
(45) Date of Patent: Nov. 16, 2010

(54) THIN FILM PATTERN FORMING DEVICE AND METHOD

(75) Inventors: Chang-Bok Lee, Gyeonggi-Do (KR); Jung-Woong Son, Gyeonggi-Do (KR)

(73) Assignee: Top Engineering Co., Ltd., Paju (KR)

( * ) Notice: Subject to any disclaimer, the term of this patent is extended or adjusted under 35 U.S.C. 154(b) by 1012 days.

(21) Appl. No.: 11/592,255

(22) Filed: Nov. 3, 2006

(65) Prior Publication Data

US 2007/0148560 A1    Jun. 28, 2007

(30) Foreign Application Priority Data

Dec. 8, 2005    (KR) .................... 10-2005-0119855

(51) Int. Cl.
    *H01L 21/20*    (2006.01)
(52) U.S. Cl. .................... 250/492.2; 438/771; 977/720; 977/777; 977/787; 977/858
(58) Field of Classification Search .............. 250/492.1, 250/492.2, 492.21, 492.22, 492.3, 396 R, 250/504 R; 977/701, 712, 720, 721, 722, 977/723, 745, 766, 777, 787, 858, 859, 707, 977/767, 771, 786, 855, 860; 438/478, 479, 438/485, 758, 771
    See application file for complete search history.

(56) References Cited

U.S. PATENT DOCUMENTS 7,544,938 B1 *    6/2009    Stewart et al. .............. 250/310

| | | | |
|---|---|---|---|
| 2002/0039166 A1 * | 4/2002 | Song | 349/156 |
| 2004/0033679 A1 * | 2/2004 | Jacobson et al. | 438/510 |
| 2004/0160505 A1 * | 8/2004 | Ando | 347/112 |
| 2005/0176849 A1 * | 8/2005 | Yang | 523/160 |
| 2006/0145146 A1 * | 7/2006 | Suh et al. | 257/40 |
| 2006/0164813 A1 * | 7/2006 | Yoshioka et al. | 361/717 |
| 2006/0279843 A1 * | 12/2006 | Kurt et al. | 359/558 |
| 2008/0041814 A1 * | 2/2008 | Romano et al. | 216/13 |
| 2008/0286521 A1 * | 11/2008 | Eberlein et al. | 428/114 |

FOREIGN PATENT DOCUMENTS

CN    1511086    7/2004
CN    1660597    8/2005

OTHER PUBLICATIONS

Chinese Office Action date Jan. 4, 2008.

* cited by examiner

*Primary Examiner*—Jack I Berman
*Assistant Examiner*—Nicole Ippolito Rausch
(74) *Attorney, Agent, or Firm*—KED & Associates, LLP

(57) ABSTRACT

A thin film pattern forming device includes a chamber case having an inner space communicated with the outside, a first fixing unit provided in the chamber case, a pattern electrode plate having a certain shape and fixed to the first fixing unit, and a second fixing unit provided in the chamber case and spaced apart from the pattern electrode plate. A substrate on which an inked metallic nano-material is deposited is received on the second fixing unit. The device also includes a power supply unit for supplying power to the first fixing unit and the second fixing unit, and a drying unit for drying the inked metallic nano-material patterned on the substrate.

18 Claims, 4 Drawing Sheets

THIN FILM PATTERN FORMING DEVICE AND METHOD

RELATED APPLICATION

The present disclosure relates to subject matter contained in priority Korean Application No. 10-2005-0119855, filed on Dec. 8, 2005, which is herein expressly incorporated by reference in its entirety.

BACKGROUND OF THE INVENTION

1. Field of the Invention

The present invention relates to a thin film pattern forming device and method, and more particularly, to a thin film pattern forming device and method which are capable of simply forming a metal thin film line such as a gate line on a substrate, capable of reducing a manufacturing time, and simplifying an entire structure.

2. Description of the Background Art

Generally, a liquid crystal display (LCD) comprises a rear substrate having driving devices such as a transistor on a plate type glass, a front substrate having a color filter layer, etc on a plate type glass, a sealant bonding the rear substrate and the front substrate to each other, and a liquid crystal layer contained between the rear substrate and the front substrate.

Aligning of liquid crystal molecules of the liquid crystal layer is controlled by suitable operation of the driving devices of the rear substrate. An optical property of the liquid crystal layer is controlled by the alignment of the liquid crystal molecules, for thereby displaying an image.

In order to manufacture the rear substrate and the front substrate, a driving device or a color filter layer is formed on a substrate (glass) by a semiconductor fabrication process. A general process for forming a metal thin film line such as a gate line, etc. on a substrate will be explained.

As shown in FIG. 1, a metal thin film is formed on a substrate by a sputtering device. The sputtering device includes a substrate holder 20 provided in a vacuum chamber case 10, for fixing a substrate S; a target holder 30 provided in the vacuum chamber case 10 spaced from the substrate holder 20, for fixing a sputtering target T that is of a metal material; and a power unit 40 provided at one side of the vacuum chamber case 10, for applying a voltage to the substrate holder 20 and the target holder 30.

A vacuum pump 50 is installed at one side of the vacuum chamber case 10, and a gas supply pipe 60 for supplying gas is connected to the vacuum chamber case 10.

The process for forming a metal thin film on the substrate S by using the above sputtering device will now be explained.

First, the substrate S is fixed to the substrate holder 20, and the sputtering target T is fixed to the target holder 30. Under this state, air inside the vacuum chamber case 10 is exhausted thus to vacuumize the vacuum chamber case 10, and then sputtering gas is introduced into the vacuum chamber case 10. Then, a high frequency voltage is supplied to the vacuum chamber case 10 by the power unit 40 thus to generate a plasma in the vacuum chamber case 10. Particles are generated at the sputtering target T by the plasma inside the vacuum chamber case 10. The particles are deposited on the substrate S, thereby forming a metal thin film on the substrate S. When the high frequency voltage is supplied by the power unit 40, an anode is formed at the substrate holder 20 and a cathode is formed at the target holder 30.

After the sputtering process by the sputtering device is completed, a photoresist layer is deposited on the metal thin film formed on the substrate S. Then, the photoresist layer is patterned by a photolithography and developing process so that a part of the metal thin film to be etched except for a gate line to be formed can be exposed. Then, the exposed part of the metal thin film is removed by a dry-etching process or a wet-etching process, and the remaining photoresist layer is removed thus to form a metal thin film line such as a gate line on the substrate S.

FIG. 2 is a flowchart showing the steps of a process for forming a metal thin film pattern on a substrate in accordance with the related art.

However, because the process for forming a metal thin film line such as a gate line, etc. on a substrate necessarily includes a sputtering process step, a photoresist layer depositing process step, exposing and developing process steps, an etching process step, etc., accordingly, the entire process is complicated and much processing time is required. Furthermore, each of the devices described above is required so as to respectively perform each of the processes, thereby incurring high equipment cost.

Also, the process for forming a plasma in the vacuum chamber case is very complicated. That is, in order to form a plasma in the vacuum chamber case, the vacuum chamber case must be maintained under a vacuum state, sputtering gas must be introduced into the vacuum chamber case, and a high frequency voltage must be supplied to the vacuum chamber case. Accordingly, it is difficult to construct and control the sputtering device.

SUMMARY OF THE INVENTION

Therefore, it is an object of the present invention to provide a thin film pattern forming device and method which are capable of simply forming a metal thin film line such as a gate line on a substrate, reducing processing time, and simplifying the necessary equipment.

To achieve these and other objects and advantages and in accordance with the purpose of the present invention, as embodied and broadly described herein, there is provided a thin film pattern forming device, comprising: a chamber case having an interior space communicated with the outside; a first fixing unit provided in the chamber case; a pattern electrode plate having a protrusion electrode protruded with a certain shape, and fixed to the first fixing unit; a second fixing unit provided in the chamber case and spaced apart with a certain gap from the pattern electrode plate, for fixing a substrate on which an inked metallic nano-material is deposited; a power supply unit for supplying power to the first fixing unit and the second fixing unit so as to form electrodes thereat; and a drying unit for drying a metal thin film line patterned on the substrate.

To achieve these and other advantages and in accordance with the purpose of the present invention, as embodied and broadly described herein, there is also provided a thin film pattern forming method, comprising: depositing an inked metallic nano-material on a substrate; applying an electron flux in a predetermined pattern onto the substrate having the inked metallic nano-material deposited thereon; and drying the inked metallic nano-material patterned with the predetermined pattern by the electron flux.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Hereinafter, a thin film pattern forming device and method according to the present invention will be explained with reference to the attached drawings.

Figure 1:
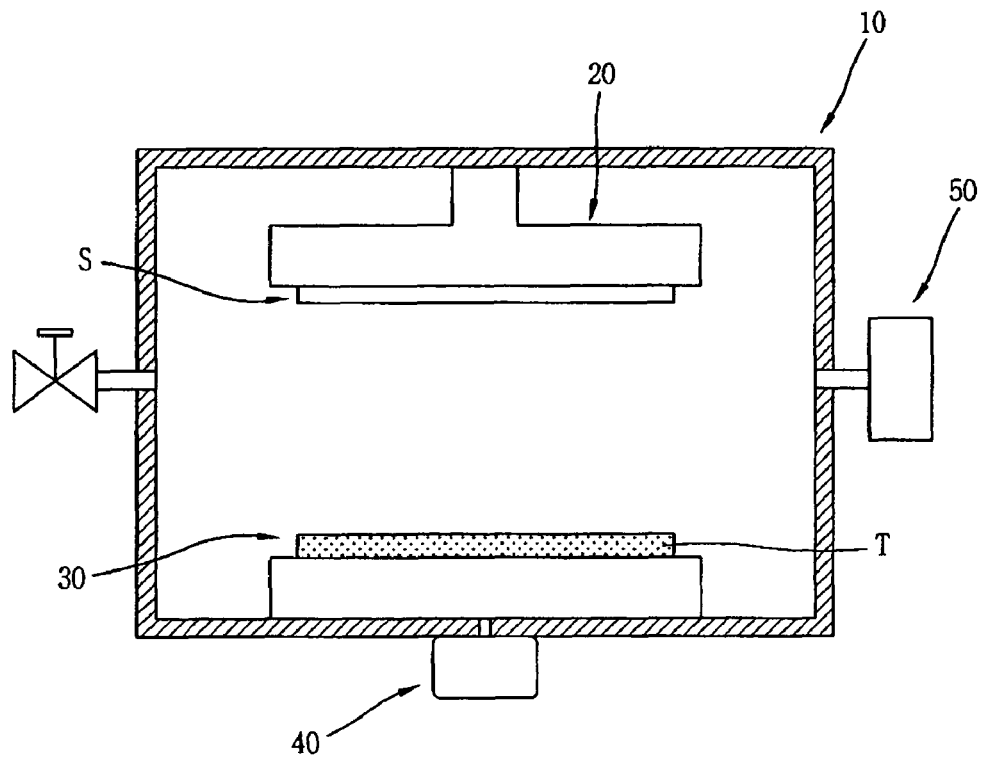
FIG. 1 is a schematic cross section view showing a sputtering device in accordance with the related art.
Figure 2:
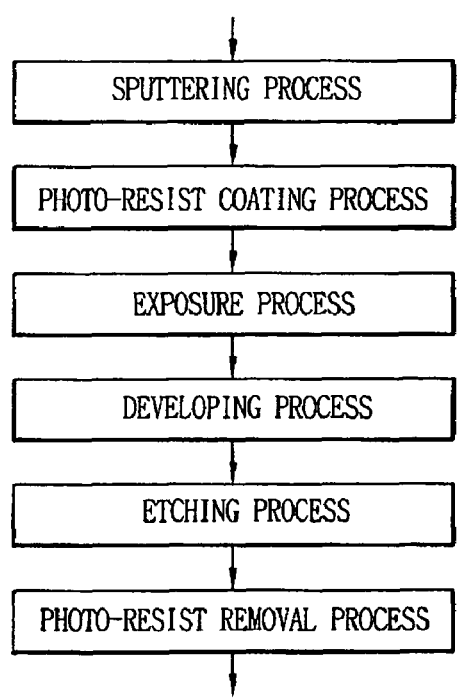
FIG. 2 is a flowchart showing a process for forming a metal thin film pattern on a substrate in accordance with the related art.
Figure 3:
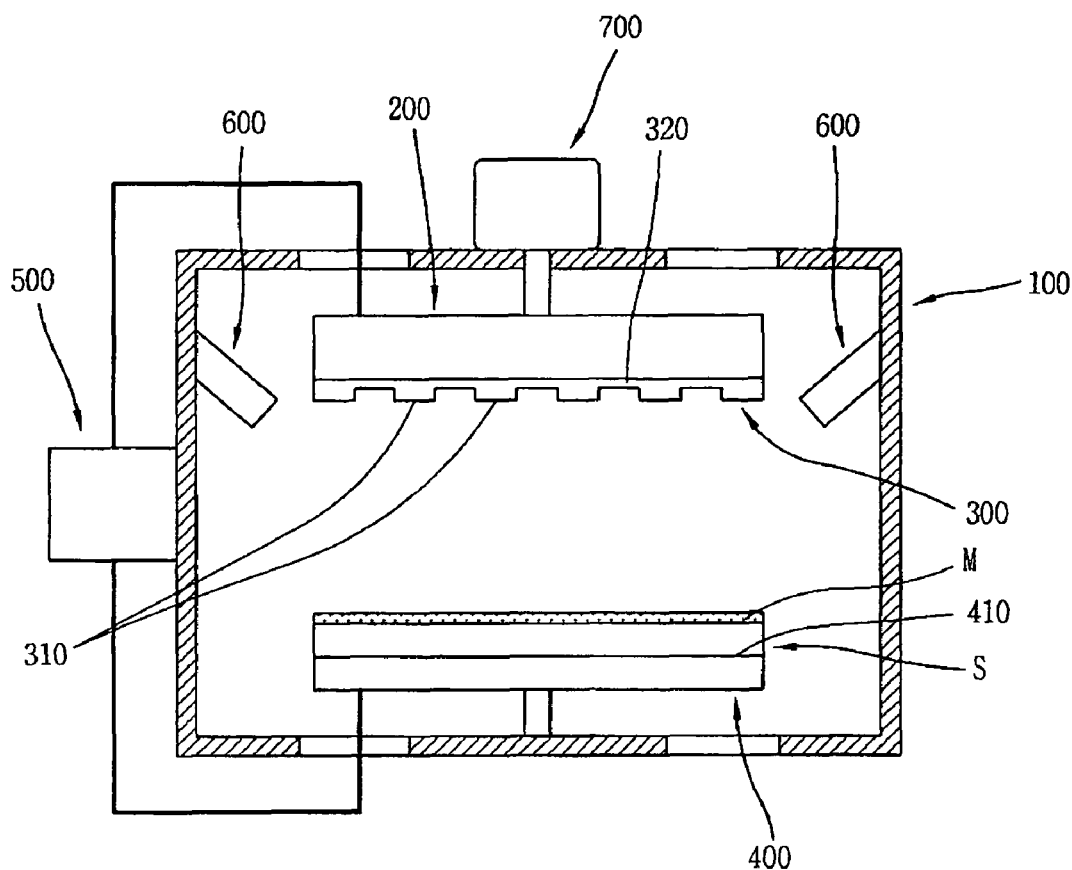
FIG. 3 is a schematic cross-section view showing a thin film pattern forming device according to the present invention.

FIG. 3 is a schematic cross-section view showing a thin film pattern forming device according to the present invention.

As shown, the thin film pattern forming device according to the present invention comprises: a chamber case 100 enclosing a certain space therein; a first fixing unit 200 provided in the chamber case 100; a pattern electrode plate 300 having a protrusion electrode 310 protruded with a certain shape, and fixed to the first fixing unit 200; a second fixing unit 400 provided in the chamber case and spaced apart with a certain gap from the pattern electrode plate 300; a power supply unit 500 supplying power to the first fixing unit 200 and the second fixing unit 400 so as to form electrodes thereat; and a drying unit 600 provided in the chamber case 100, for drying a metal thin film line patterned on a substrate.

The chamber case 100 is communicated with the outside so as to be in an atmospheric pressure state.

A driving unit 700 for linearly-reciprocating the first fixing unit 200 is mounted at the chamber case 100. The driving unit 700 is connected to the first fixing unit 200 thus to linearly-reciprocate the first fixing unit 200.

The pattern electrode plate 300 includes a base portion 320 having a certain area and thickness, and a protrusion electrode 310 protruding from one surface of the base portion 320 with a certain pattern. The protrusion electrode 310 serves to form a pattern such as a gate line on the substrate S.

Figure 4:
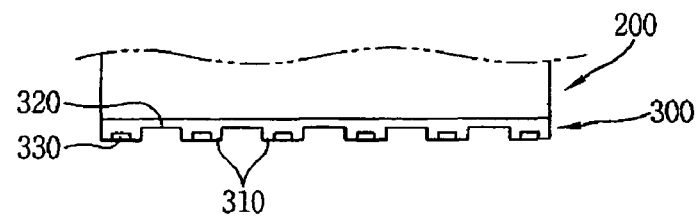
FIG. 4 is an enlarged partial view showing details of a pattern electrode plate of the thin film pattern forming device in FIG. 3 according to the present invention.

As shown in FIG. 4, a power supply line 330 may be additionally installed at the protrusion electrode 310 so as to increase an electrode intensity of the protrusion electrode 310. The power supply line 330 may be connected to the power supply unit 500 for supplying power to the first fixing unit 200, or may be connected to an additional power supplying unit. The power supply line is formed of a material having more excellent conductivity than the pattern electrode plate.

The pattern electrode plate 300 can be fixed to the first fixing unit 200 by various methods. As one of the various methods, a vacuum suction structure can be provided at the first fixing unit 200.

The second fixing unit 400 has a certain area, and is provided with a planar supporting surface 410 at an upper edge thereof. On the supporting surface 410, the substrate S with an inked metallic nano-material M deposited thereon is positioned. The substrate S is formed to have a certain thickness and area, and a glass plate can be used as the substrate. The inked metallic nano-material M is formed by mixing a metallic nano material of a powder form with a solvent.

The substrate S can be fixed to the second fixing unit 400 by various methods. As one of the various methods, a vacuum suction structure can be provided at the second fixing unit 400.

Figure 5:
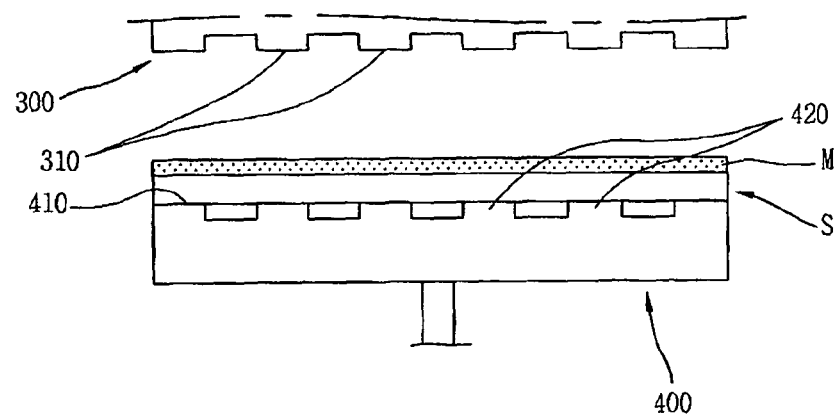
FIGS. 5 and 6 are enlarged partial views showing details of a second fixing unit of the thin film pattern forming device in FIG. 3 according to the present invention.

As a modification example of the second fixing unit 400, as shown in FIG. 5, a protrusion electrode 420 is formed so as to have a shape corresponding to the protrusion electrode 310 of the pattern electrode plate 300.

Figure 6:
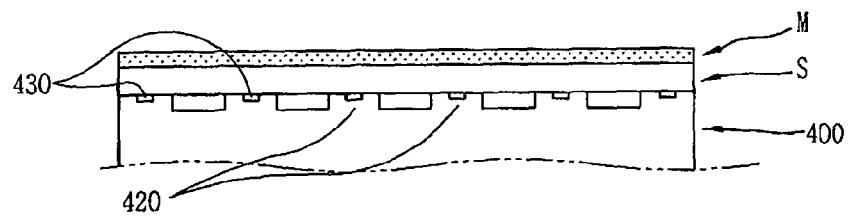

As shown in FIG. 6, a power supply line 430 may be additionally installed at the protrusion electrode 420 so as to increase an electrode intensity of the protrusion electrode 420 of the second fixing unit 400. The power supply line 430 may be connected to the power supply unit 500 for supplying power to the second fixing unit 200, or may be connected to an additional power supply unit.

The drying unit 600 dries the inked metallic nano-material M deposited on the substrate S and then patterned in a predetermined shape. The drying unit 600 can be variously implemented. Preferably, the drying unit 600 is implemented as an ultraviolet ray lamp for emitting ultraviolet light.

The drying unit 600 is installed in the chamber case 10 so as to be positioned at an upper side of the second fixing unit 400. Preferably, the drying unit 600 is implemented in plurality.

Figure 7:
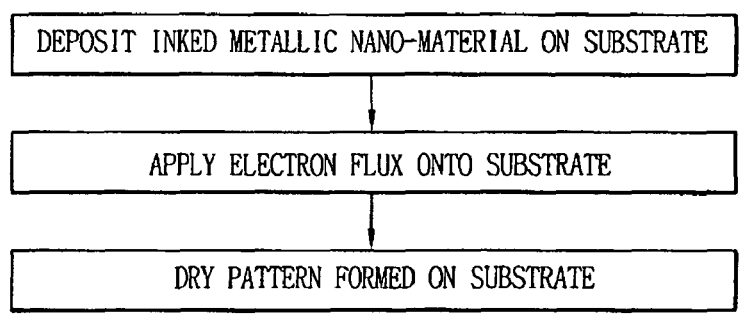
FIG. 7 is a flowchart showing steps of a process for forming a thin film pattern on a substrate according to the present invention.

FIG. 7 is a flowchart showing the steps of the process for forming a thin film pattern on a substrate according to the present invention.

As shown, the thin film pattern forming method according to the present invention comprises: depositing an inked metallic nano-material on a substrate; applying an electron flux in a predetermined pattern onto the substrate with the inked metallic nano-material deposited thereon; and drying the inked metallic nano-material patterned in the predetermined pattern by the electron flux. The above process steps are performed in an atmospheric pressure state.

As one example, the substrate is implemented as a glass plate having a certain thickness and area.

The inked metallic nano material is formed by mixing a metallic nano-material of a powder form with a solvent.

Figure 8:
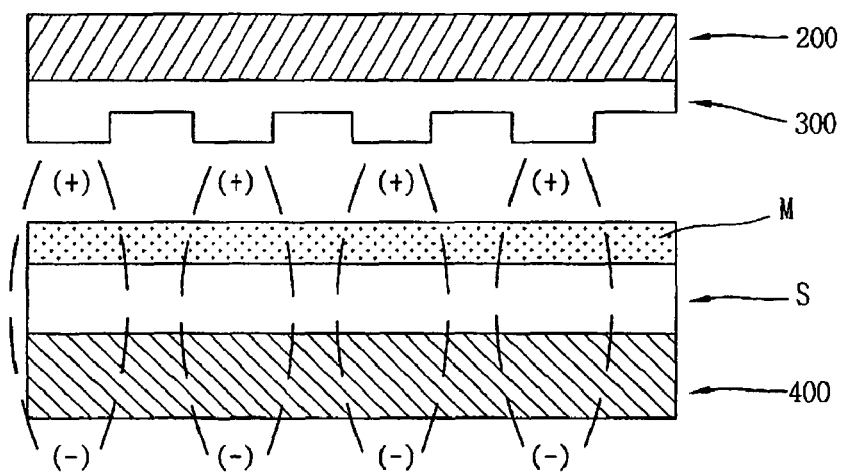
FIG. 8 is a schematic view showing an operation state of the thin film pattern forming device according to the present invention.

The process for applying the electron flux onto the substrate will be explained with reference to FIG. 8. First, the substrate S is positioned between an anode having a predetermined pattern and a cathode having a size corresponding to that of the anode. Then, power is supplied to the anode and the cathode thus to form an electron flux therebetween. The pattern of the anode may include various patterns such as a gate line, etc.

The process for drying the inked metallic nano-material deposited on the substrate S in a predetermined pattern can be variously implemented. As one example, ultraviolet light is irradiated onto the substrate thus to dry the inked metallic nano-material deposited on the substrate in a predetermined pattern.

Hereinafter, an operation of the thin film pattern forming device and method will be explained.

First, the pattern electrode plate 300 having the protrusion electrode 310 of a predetermined pattern is fixed to the first fixing unit 200. Then, the substrate S on which the inked metallic nano-material M is deposited is fixed to the supporting surface 410 of the second fixing unit 400. Then, the first fixing unit 200 is moved by the driving unit 700 so that the gap between the pattern electrode plate 300 fixed to the first fixing unit 200 and the substrate S fixed to the second fixing unit 400 can be controlled as a preset gap.

After controlling the gap between the pattern electrode plate 300 and the substrate S as a preset gap, a voltage is supplied between the first fixing unit 200 and the second fixing unit 400. Herein, an anode is formed at the pattern electrode plate 300, and a cathode is formed at the second fixing unit 400.

Accordingly as the voltage is applied between the first fixing unit 200 and the second fixing unit 400, a flux of electrons is formed between the pattern electrode plate 300 and the second fixing unit 400. The electron flux is concentrated on the protrusion electrode 310 of the pattern electrode plate 300, and the inked metallic nano-material M deposited on the substrate S is concentrated by the flux. Accordingly, the inked metallic nano-material M is patterned on the substrate S with a shape corresponding to that of the protrusion electrode 310 of the pattern electrode plate 300.

When the protrusion electrode 420 is formed on an upper surface of the second fixing unit 400 with a shape corresponding to that of the protrusion electrode 310 of the pattern electrode plate 300, the electron flux formed between the protrusion electrode 310 of the pattern electrode plate and the protrusion electrode 420 of the second fixing unit has an increased intensity. Accordingly, the inked metallic nano material M deposited on the substrate S can be more effectively patterned.

When a wire 330 is formed at the protrusion electrode 310 of the pattern electrode plate 300, the flux formed at the protrusion electrode 310 has an increased intensity. Accordingly, the inked metallic nano material M deposited on the substrate S can be more effectively patterned.

After completing the patterning of the inked metallic nano material M on the substrate S, the voltage supplied to the first fixing unit 200 and the second fixing unit 400 is cut off. Then, the first fixing unit 200 is moved by the driving unit 700 so that the first fixing unit 200 and the second fixing unit 400 can maintain a preset gap therebetween. Then, the inked metallic nano material M patterned on the substrate S is dried by the drying unit 600. Accordingly, a metal thin film pattern having a shape corresponding to that of the protrusion electrode 310 of the pattern electrode plate 300 is formed on the substrate S. The pattern of a metal thin film formed on the substrate S is determined according to the pattern of the protrusion electrode 310 of the pattern electrode plate 300.

When the voltage is supplied to the first fixing unit 200 and the second fixing unit 400 after patterning the inked metallic nano material M on the substrate S in a predetermined pattern, the drying unit 600 is operated thus to dry the inked metallic nano material M patterned on the substrate S.

The thin film pattern forming method according to the present invention comprises: depositing an inked metallic nano material M on a substrate S; applying an electron flux in a predetermined pattern onto the substrate S with the inked metallic nano-material M deposited thereon; and drying the inked metallic nano-material patterned in the predetermined pattern by the electron flux.

The process steps subsequent to the process steps of depositing the inked metallic nano-material M on the substrate S are advantageously performed by employing the thin film pattern forming device of the present invention.

In the present invention, an inked metallic nano-material M is deposited on a substrate S, a flux of electrons is applied onto the substrate thus to form a pattern, and then the pattern is dried. Accordingly, the entire process is more simplified than in the related art when massive producing the same pattern, thereby shortening a required processing time.

Furthermore, in the present invention, a metal thin film pattern may be formed on the substrate S on which the inked metallic nano material M is deposited by using only one piece of equipment, thereby not requiring a large number of pieces of equipment.

In the present invention, since the metal thin film pattern can be formed on the substrate S under an atmospheric pressure state, the entire operation is facilitated. That is, whereas the related art sputtering device has to maintain a plasma state therein, such an additional condition is not required in the present invention. Accordingly, the entire operation is simplified in the present invention.

As aforementioned, by the present invention, a metal thin film pattern can be formed on the substrate easily and simply thus to reduce the required processing time and enhance the productivity. Furthermore, the equipment required in order to form the metal thin film pattern on the substrate is simplified thus to reduce an installation cost and a manufacturing cost. Accordingly, product competitiveness is enhanced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A thin film pattern forming device, comprising:
a chamber case having an inner space formed therein;
a first fixing unit provided in the chamber case;
a pattern electrode plate fixed to the first fixing unit, the pattern electrode plate including a first protrusion electrode protruding therefrom in a certain shape;
a second fixing unit provided in the chamber case, facing and spaced apart from the pattern electrode plate, wherein the second fixing unit receives thereon a substrate on which an inked metallic nano material is deposited;
a power supply unit that supplies power to the first fixing unit and the second fixing unit; and
a drying unit that dries the inked metallic nano material that has been patterned on the substrate, wherein the inked nano material deposited on the substrate is patterned on the substrate in a shape corresponding to the shape of the first protrusion electrode in response to a flux generated by the supplied power.

2. The thin film pattern forming device of claim 1, further comprising a power supplying line provided at the first protrusion electrode of the pattern electrode plate.

3. The thin film pattern forming device of claim 1, further comprising a second protrusion electrode that protrudes from the second fixing unit and has a shape corresponding to that of the first protrusion electrode.

4. The thin film pattern forming device of claim 3, further comprising a power supply line provided at at least one of the first protrusion electrode or the second protrusion electrode so as to increase an electrode intensity of the at least one of the first protrusion electrode or the second protrusion electrode.

5. The thin film pattern forming device of claim 1, wherein the drying unit irradiates ultraviolet light so as to dry the inked metallic nano material patterned on the substrate.

6. The thin film pattern forming device of claim 3, wherein outermost surfaces of the second protrusion electrode form a supporting surface configured to receive a substrate thereon, and wherein the first protrusion electrode protrudes outward from the pattern electrode plate toward the second protrusion electrode.

7. A thin film pattern forming method, comprising:
depositing an inked metallic nano material on a substrate;
thereafter applying a concentrated flux to the inked metallic nano-material on the substrate, the concentrated flux being applied in a predetermined pattern;
patterning the inked metallic nano-material in a shape corresponding to the predetermined pattern; and
drying the patterned inked metallic nano-material on the substrate.

8. The method of claim 7, wherein the depositing, applying, patterning and drying steps are all performed under an ambient atmospheric pressure state.

9. The method of claim 7, wherein applying a concentrated flux to the inked metallic nano-material on the substrate comprises applying a first voltage to a first fixing unit such that the first fixing unit functions as an anode, and applying a second voltage to a second fixing unit configured to receive a substrate thereon such that the second fixing unit functions as a cathode, so as to generate a concentrated flux between the first and second fixing units.

10. The method of claim 9, wherein patterning the inked metallic nano-material in a shape corresponding to the predetermined pattern comprises concentrating the flux in a pattern corresponding to a shape of a pattern electrode plate coupled to the first fixing unit.

11. The thin film pattern forming device of claim 1, wherein a first surface of the pattern electrode plate faces the first fixing unit, and the first protrusion electrode protrudes outward from a second surface of the pattern electrode plate opposite the first surface thereof, toward a supporting surface of the second fixing unit configured to receive a substrate thereon.

12. A method of forming a thin film pattern, the method comprising:

positioning a pattern electrode plate on a first fixing device;
depositing an inked metallic nano material on a substrate and positioning the substrate on a second fixing device opposite the first fixing device;
moving the first fixing device toward the second fixing device so as to form a predetermined gap between the substrate and the first fixing device;
applying power to at least one of the first fixing device or the second fixing device so as to direct a concentrated flux at the inked metallic nano material, the concentrated flux being directed in a predetermined pattern so as to pattern the inked metallic nano material in the predetermined pattern;
cutting power to the at least one of the first fixing device or the second fixing device and moving the first fixing device away from the second fixing device; and
drying the inked metallic nano material on the substrate in the predetermined pattern.

13. The method of claim 12, wherein the substrate is positioned between the first and second fixing devices, with the inked metallic nano material facing the first fixing device.

14. The method of claim 13, wherein applying power to at least one of the first fixing device or the second fixing device comprises applying a first voltage to a first fixing device such that the first fixing device functions as an anode, and applying a second voltage to a second fixing device such that the second fixing device functions as a cathode, so as to generate a concentrated flux between the first and second fixing devices.

15. The method of claim 14, wherein applying a first voltage to the first fixing device comprises applying the first voltage to a pattern electrode plate provided on the first fixing device, the pattern electrode plate including a first protrusion electrode that protrudes from a surface of the first fixing device in the predetermined pattern toward the second fixing device.

16. The method of claim 15, further comprising a first power supply line provided at the first protrusion electrode so as to increase an electrode intensity of the first protrusion electrode.

17. The method of claim 15, wherein applying a second voltage to the second fixing device comprises applying the second voltage to a second protrusion electrode that protrudes in the predetermined pattern from a surface of the second fixing device configured to receive the substrate thereon.

18. The method of claim 17, further comprising a second power supply line provided at the second protrusion electrode so as to increase an electrode intensity of the second protrusion electrode.

* * * * *